United States Patent
Tsuruta

(10) Patent No.: US 6,567,898 B1
(45) Date of Patent: May 20, 2003

(54) MEMORY CONTROLLER AND AN INFORMATION PROCESSING APPARATUS WITH IMPROVED EFFICIENCY

(75) Inventor: Toru Tsuruta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 236 days.

(21) Appl. No.: 09/609,972

(22) Filed: Jul. 6, 2000

(30) Foreign Application Priority Data

Jul. 7, 1999 (JP) ............................................. 11-193120

(51) Int. Cl.$^7$ ............................................. G06F 12/00
(52) U.S. Cl. ........................ 711/154; 711/109; 711/201
(58) Field of Search ................................. 711/154, 109, 711/201; 708/209; 710/52; 365/78, 189.12

(56) References Cited

U.S. PATENT DOCUMENTS

| | | | | |
|---|---|---|---|---|
| 3,999,052 | A | * 12/1976 | Gooding et al | 711/154 |
| 5,170,477 | A | * 12/1992 | Potter et al. | 711/201 |
| 5,392,406 | A | 2/1995 | Peterson et al. | 395/325 |
| 5,517,627 | A | 5/1996 | Petersen | 395/311 |
| 5,619,715 | A | 4/1997 | Dinkjiam et al. | 395/800 |
| 5,961,575 | A | * 10/1999 | Hervin et al. | 708/209 |
| 6,359,908 | B1 | * 3/2002 | Soda | 370/503 |

FOREIGN PATENT DOCUMENTS

| | | | |
|---|---|---|---|
| EP | 0 869 430 | 10/1998 | ............. G06F/5/06 |
| JP | 52-136533 | 11/1977 | ............. G06F/13/00 |
| JP | 58-149548 | 9/1983 | ............. G06F/13/00 |
| JP | 4-181454 | 6/1992 | ............. G06F/13/38 |

OTHER PUBLICATIONS

Awsienko et al., "Boundary Aligner," IBM Technical Disclosure Bulletin, p. 4247–4248, Dec. 1984.*

* cited by examiner

Primary Examiner—Matthew Kim
Assistant Examiner—Stephen Elmore
(74) Attorney, Agent, or Firm—Staas & Halsey LLP

(57) ABSTRACT

A memory controller includes a memory unit having an n-byte memory data width, a register unit consecutively reading out, in response to an enable signal supplied thereto, data from the memory unit having n-byte size, the register unit further recording therein the data read out from the memory unit in the form of continuous data of 2n−1 bytes including the last data read out from the memory unit, a shifter unit selecting consecutively a block of continuous n-byte data from the continuous data of 2n−1 bytes recorded in the register unit, the shifter unit supplying the continuous n-byte data block to an output terminal, and a control unit controlling the memory unit, the register unit and the shifter unit.

8 Claims, 7 Drawing Sheets

FIG. 4

| START ADDR | SHIFT | |
| --- | --- | --- |
| | READ | WRITE |
| 0 | n − 1 | n − 1 |
| 1 | 0 | n − 2 |
| 2 | 1 | n − 3 |
| 3 | 2 | n − 4 |
| 4 | 3 | n − 5 |
| ⋮ | | |
| n − 1 | n − 2 | 1 |

MEMORY CONTROLLER AND AN INFORMATION PROCESSING APPARATUS WITH IMPROVED EFFICIENCY

CROSS-REFERENCE TO RELATED APPLICATION

The present application is based on Japanese priority application No.11-193120 filed on Jul. 7, 1999, the entire contents of which are hereby incorporated by reference.

BACKGROUND OF THE INVENTION

The present invention generally relates to memory controllers and information processing apparatuses having a memory controller. More particularly, the present invention is related to a memory controller controlling reading or writing operation of a memory device of a multiple-byte memory data width.

Recently, there is an intensive activity in developing a system LSI that includes a DRAM on a common semiconductor chip. Such a system LSI includes those carrying a RISC (Reduced Instruction Set Computer) processor or those carrying a processor devoted for graphic processing. By forming a DRAM integrally with a system LSI (Large Scale Integration), it is possible to reduce the size and power consumption of the electronic apparatus that uses the system LSI. Further, it becomes possible to increase the operational speed of the electronic apparatus.

In a system LSI, data read out from a memory such as DRAM is stored temporarily in a buffer unit, and a logic operation is carried out by a logic processing unit in the CPU (Central Processing Unit). Thereby, the data is stored in the memory unit with a predetermined byte width, and thus, reading of data is conducted based on the byte-width basis. By increasing the byte-width, it becomes possible to increase the data transfer rate without changing the access latency. Thus, there is a trend of technology to increase the byte width of a data bus.

FIG. 1 shows the data structure of a memory controller of a related art that includes a DRAM 10 and a buffer unit 12, wherein FIG. 1 shows reading out of data of 256 byte width. In the example of FIG. 1, it can be seen that the DRAM 10 has an n-byte memory data width ($n \geq 2$) and the starting point of data reading is located on the boundary of the n-byte memory data width (hereinafter called as "word boundary"). In such a case, the 256 byte data is read out straightforward and transferred to the buffer unit 12. In such a case, the 256 byte capacity of the buffer unit 12 is just enough for holding the data read out from the DRAM 10.

However, the situation of FIG. 1 is not a general situation and the starting point of data reading is not always located on the word boundary. Often, the starting point of data reading is located at an intermediate location of the n-byte memory data width.

FIG. 2 shows the reading of 256 byte data from the DRAM 10 for the case in which the starting point is located at an intermediate location of the nbyte memory data width. As the reading of the data is conducted every n-byte width, the data block of the nbyte size including the starting point inevitably includes unnecessary data part before the starting point. Similarly, the data block of the n-byte size including the final point of reading includes unnecessary data part after the final point. Thus, it has been necessary to provide a capacity of at least 256+n bytes for the buffer unit 12 for holding the nbyte data block read out from the DRAM 10.

Alternatively, it has been necessary to provide a data-packing unit between the DRAM 10 and the buffer unit 12 so as to extract the 256 byte data from the data of 256+n bytes read out from the DRAM 10 and supply the same to the buffer unit 12. However, such a construction has been complex and caused increase of cost of the memory controller.

SUMMARY OF THE INVENTION

Accordingly, it is a general object of the present invention to provide a memory controller wherein the foregoing problems are eliminated.

Another and more specific object of the present invention is to provide a memory controller that can achieve reading or writing of data from or to a memory device with a simplified construction and improved efficiency.

Another object of the present invention is to provide a memory controller, including:

a memory unit having an n-byte memory data width:

a register unit consecutively reading out, in response to an enable signal supplied thereto, data from said memory unit with every n-byte size, said register unit further recording therein said data read out from said memory unit in the form of continuous data of 2n−1 bytes including the last data read out from said memory unit;

a shifter unit selecting consecutively, in response to a shift signal supplied thereto, a block of continuous n-byte data from said continuous data of 2n−1 bytes recorded in said register unit, said shifter unit supplying said continuous n-byte data block to an output terminal; and a control unit controlling said memory unit, said register unit and said shifter unit.

According to the present invention, requested data is selectively and efficiently read out from the memory unit according to the data width of the memory unit, even in such a case in which the starting point of data reading is located at an intermediate location of the memory data width.

Another object of the present invention is to provide a memory controller, including:

a memory unit having an n-byte memory data width;

a register unit consecutively receiving, in response to an enable signal supplied thereto, data from an external unit having n-byte size, said register unit further recording therein said data in the form of continuous data of 2n−1 bytes including the last received data;

a shifter unit selecting consecutively, in response to a shift signal supplied thereto, a continuous n-byte data block from the continuous data of 2n−1 bytes recorded in said register unit, said shifter unit storing said continuous n-byte data block in a specified location of said memory unit; and a control unit controlling said memory unit, said register unit and said shifter unit.

According to the present invention, efficient writing of data into the memory unit becomes possible even in such a case in which the starting point of data writing is located at an intermediate position of the memory data width.

Another object of the present invention is to provide a memory controller, including:

a memory unit having a n-byte memory data width;

a register unit carrying out, in response to an enable signal supplied thereto, one of a reading operation reading out data consecutively from said memory unit with every n-byte size and a receiving operation receiving data consecutively from an external unit with every n-byte size, said register unit further recording therein said data read out from said memory unit or received from said external unit in the form of continuous data of 2n−1 bytes including the last acquired data;

a shifter unit selecting consecutively, in response to a shift signal supplied thereto, a block of continuous n-byte data from said continuous data of 2n−1 bytes recorded in said register unit, said shifter unit supplying said continuous n-byte data block to an output terminal when in a mode of said reading operation, said shifter unit storing said continuous n-byte date block in a specified location of said memory unit when in a mode of said receiving operation; and a control unit controlling said memory unit, said register unit and said shifter unit.

According to the present invention, it becomes possible, when the memory controller is in the reading operation mode, to read out only those required data from the memory unit, even in such a case in which the starting point of data reading is located at an intermediate location of the memory data width. When in the receiving operation mode, on the other hand, the memory controller writes only those required data into the memory unit even in such a case in which the starting point of data writing is located at an intermediate location of the memory data width.

Other objects and further features of the present invention will become apparent from the following detailed description when read in conjunction with the attached drawings.

BRIEF DESCRIPTION OF THE DRAWINGS

FIG. 4 is a diagram showing the content of information of shift signal used in the memory controller of FIG. 3;

DETAILED DESCRIPTION OF THE INVENTION

[First Embodiment]

Figure 1:
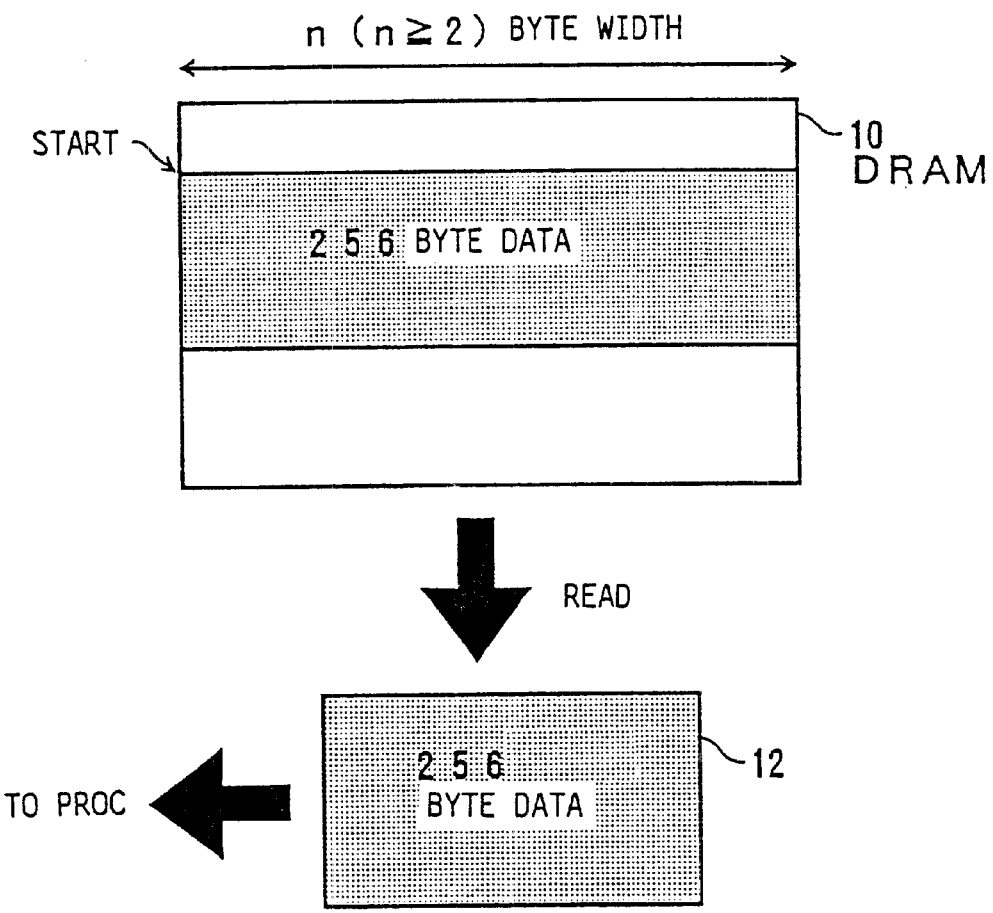
FIG. 1 is a diagram showing the data structure in a DRAM and a buffer unit cooperating with the DRAM according to a memory controller of a related art.
Figure 2:
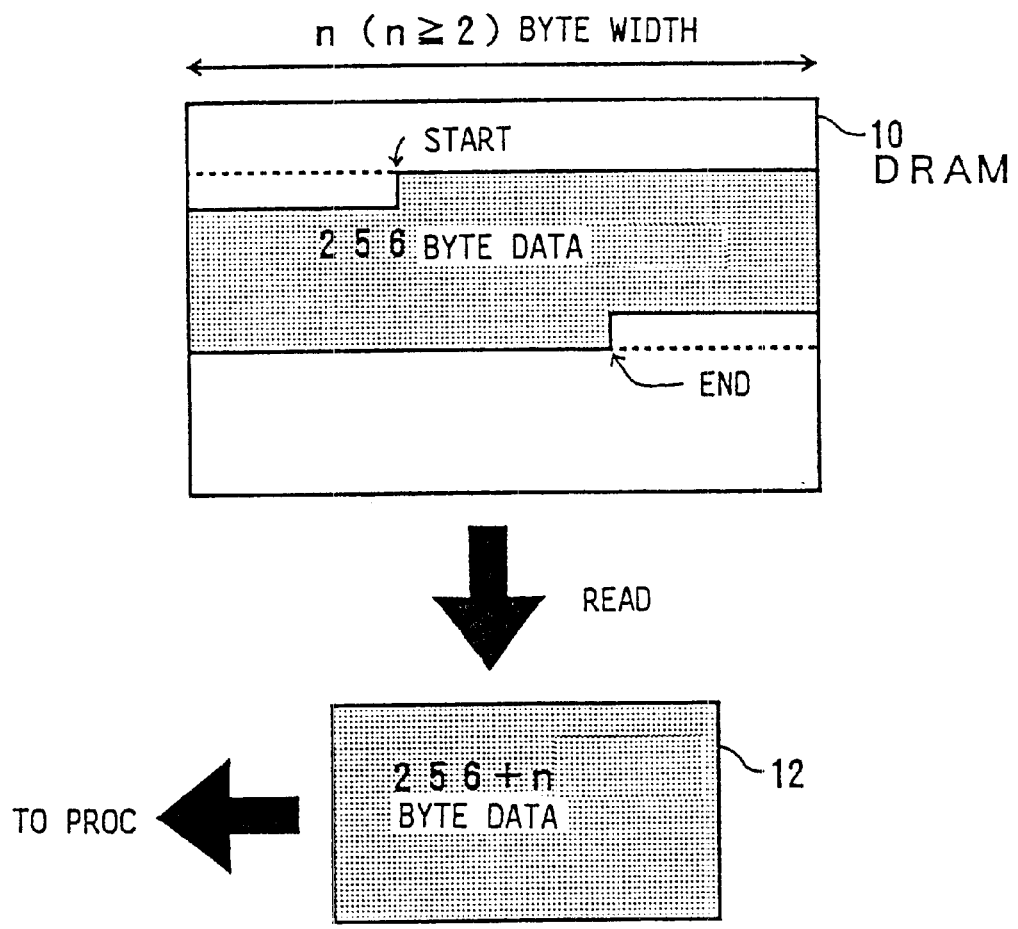
FIG. 2 is a diagram showing the problem occurring in the memory controller of FIG. 1 when an starting point of data reading is located at an intermediate location of a memory data width.
Figure 3:
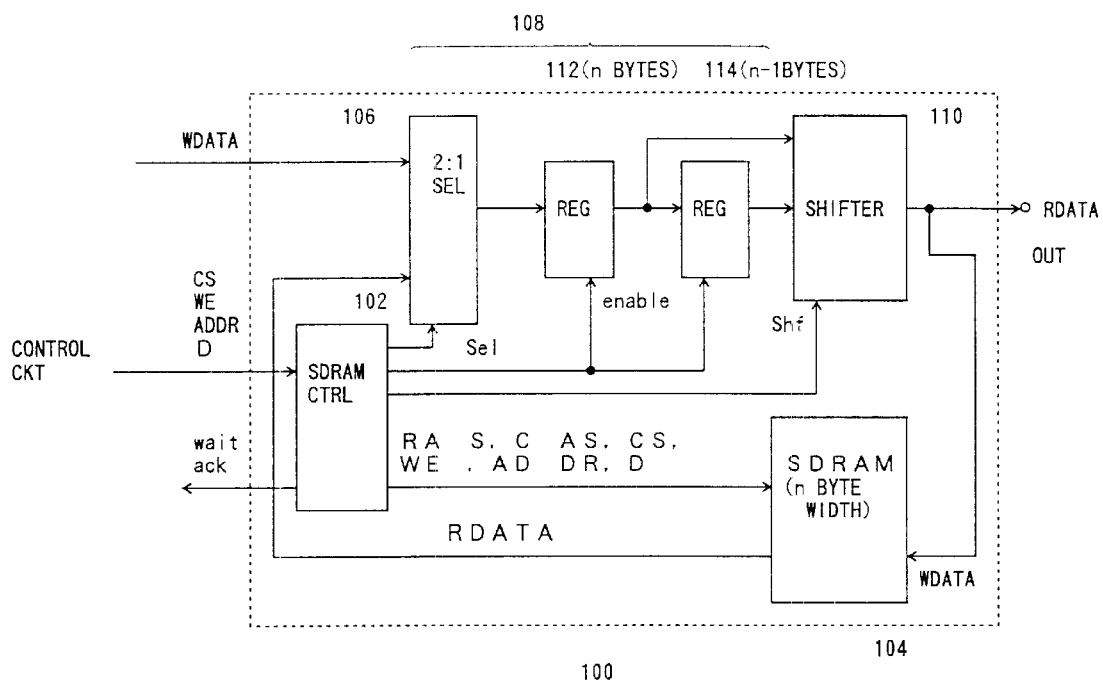
FIG. 3 is a block diagram showing the construction of a memory controller according to a first embodiment.

FIG. 3 is a block diagram showing the construction of a memory controller 100 according to a first embodiment of the present invention.

Referring to FIG. 3, the memory controller 100 includes a controller 102, a memory 104 having a memory data width of n-bytes, a 2:1 selector 106, a register 108, and a shift register 110, wherein the register 108 includes a first register 112 of n-byte data width and a second register 114 of (n−1)-byte data width. It should be noted that an SDRAM (synchronous dynamic random access memory) is used for the memory 104 in the illustrated example, while it should be noted that the memory 104 is by no means limited to an SDRAM but various other memory devices such as DRAM or FeRAM (ferroelectric random access memory) may be used for the memory 104. In the foregoing construction of FIG. 3, it should be noted that "n" is an integer such as 16.

The controller 102 of the SDRAM 104 is supplied with various control signals including a chip select signal (CS), a write enable signal (WE), a start-address signal ADDR, a data-length signal D, and the like, from an external circuit not illustrated. In response to the control signals noted above, the controller 102 produces a row-address strobe signal RAS and a column-address strobe signal CAS, and supplies the address strobe signals RAS and CAS to the SDRAM 104 together with the chip select signal CS, write enable signal WE, the start-address signal ADDR and the data-length signal D. Thereby, the controller 102 performs a read control operation for reading data from the SDRAM 104 or writing control operation for writing data into the SDRAM 104.

More specifically, the controller sends back, in response to a detection of incoming of a chip select signal CS from the external circuit, a wait signal WAIT to the external circuit, indicative that accessing of the SDRAM 104 has been commenced. As long as the waiting signal WAIT is active, no other accessing to the SDRAM 104 is allowed. In response to the chip select signal CS, the SDRAM controller 102 also sends back an acknowledging signal "ack" to the external circuit. It should be noted that the acknowledge signal "ack" indicates data-enabling in the case of reading out of data from the SDRAM 104, while the acknowledge signal "ack" indicates a reception of write data WDATA by the memory controller 100.

As noted above, the chip select signal CS indicates the commencement of access to the SDRAM 104. Further, the write enable signal WE indicates writing of data into the SDRAM 104 conducted on the byte-to-byte basis. When the write enable signal WE is off during the interval in which accessing is made to the SDRAM 104, this means that reading of data from the SDRAM 104 is in progress. Thereby, the initial address of data reading is specified by the start-address signal ADDR. In the writing mode for writing data into the SDRAM 104, the start-address signal ADDR represents the initial address of data writing. Further, the data length D represents the length of the data read out from the SDRAM 104 starting from the initial address specified by the start-address signal ADDR, in terms of bytes in the reading mode of the memory controller 100. In the writing mode of the memory controller 100, the data length D represents the length of the data to be written into the SDRAM starting from the initial address signal ADDR, in terms of bytes.

The controller 102 further supplies a select signal sel to the 2:1 selector 106 and an enable signal to the registers 112 and 114. Further, the controller 102 supplies a shift signal shf to the shift register 110.

In the read mode operation of the memory controller 100 for reading out data from the SDRAM 104, read data RDATA is obtained from the SDRAM 104 in response to the start-address signal ADDR and the data length D and the read data RDATA thus read out is supplied to the 2:1 selector 106. In the write mode operation of the memory controller 100 for writing data into the SDRAM 104, on the other hand, write data WDATA is supplied to the 2:1 selector 106 form an external circuit outside the memory controller 100.

The 2:1 selector 106, in turn, discriminates whether reading or writing is to be made to the SDRAM 104 based on the select signal sel supplied from the controller 102. In the case the 2:1 selector 106 has decided, based on the select signal sel, that a data reading is to be made, the 2:1 selector 106 selects n-bytes of the read data read out from the SDRAM 104 and supplies the same to the register 112. In the event the 2:1 selector 106 has decided, based on the select signal sel, that a writing is to be made to the SDRAM 104, the 2:1 selector 106 extracts n-bytes of the write data WDATA from the external circuit and supplies the same to the register 112.

The register 114 then extracts, in response to the enablesignal "enable," the data of (n−1) bytes from the read data RDATA or write data WDATA, which has been stored in the register 112 in the previous operational cycle, and stores the (n−1) byte data thus extracted therein, wherein the initial point for counting the foregoing (n−1) bytes is set to the address next to the starting address.

The shifter 110 then extracts consecutive data of n-byte size from the data held in the registers 112 and 114, wherein the data thus held in the registers 112 and 114 have a total size of (2n−1) bytes. When reading data, the shift register 110 supplies the n-byte data held therein to an external circuit via an output terminal as the read data RDATA. In the write mode operation, on the other hand, the shift register 110 extracts n-byte data from the write data WDATA and writes the extracted data into the SDRAM 104, starting from the address specified by the start-address ADDR.

FIG. 4 shows the content of the information carried by the shift signal shf.

Referring to FIG. 4, it can be seen that the shift signal shf includes information with regard to the relationship between the starting address number of the data to be written-in or read-out, to or from the SDRAM 104, and a shift. In the case the starting address of the data to be read out from the SDRAM 104 is "1," the shift is set to zero. In such a case, a data train of n-bytes starting from the lowermost bit and continuing to the upper bits of the register 114, is selected by the shifter 110. In the case the data to be read out from the SDRAM 104 has the lowermost bit at the address 2, on the other hand, FIG.4 indicates that the amount of the shift should be 1. In this case, the part of the data to be extracted by the shift register 110 is shifted in the higher bit direction by one place 1. In other words, the shift register 110 extracts n-bits of continuous data starting from the second smallest bit of the register 114 and continuing in the register 114 in the higher bit direction.

Next, the operation of the registers 112 and 114 and the shifter 110 for the case of reading data from the SDRAM 104 will be explained in more detail with reference to FIGS. 5 and 6. In the explanation below, it is assumed that the SDRAM 104 has a memory data width n of 16 bytes (n=16) and that the reading is made from the SDRAM 104 for the data of 32 bits, starting from the address 3 located at an intermediate location of the memory data width of the SDRAM 104, to the address 34 located also at an intermediate location.

Figure 5:
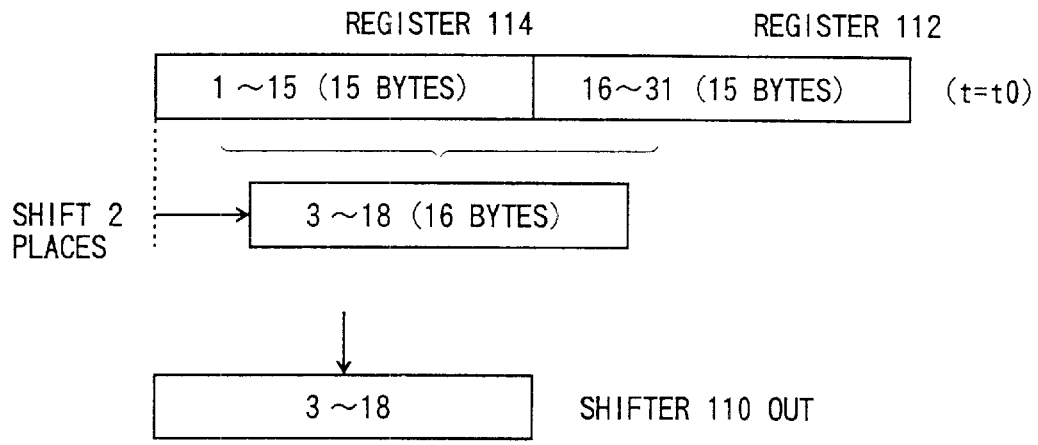
FIG. 5 is a diagram showing the state of a register and a shifter in the memory controller of FIG. 3 at a time t0 when reading of data is to be made.
Figure 6:
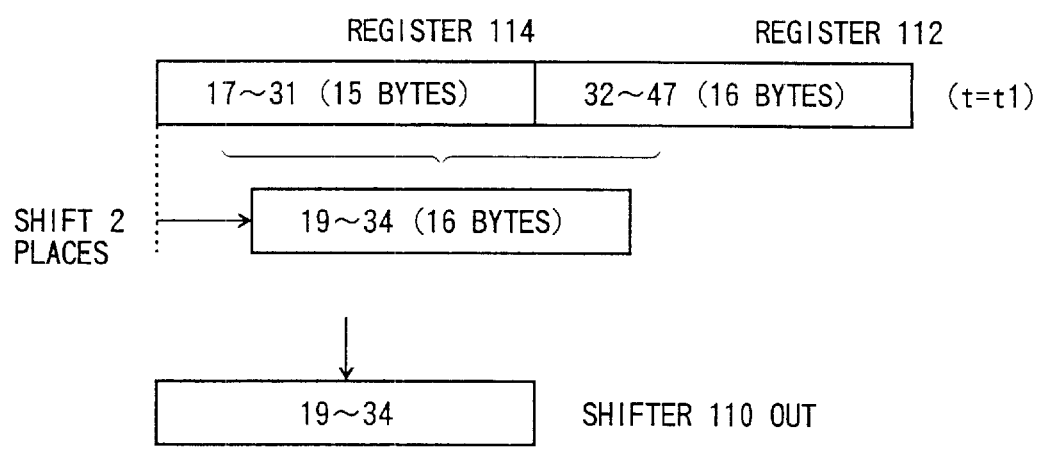
FIG. 6 is a diagram showing the state of the register and the shifter at a time t1 when reading of data is to be made.

FIG. 5 shows the state of the registers 112 and 114 and the state of the register 110 at a time $t_0$ corresponding to the moment of reading of the data, while FIG. 6 shows the state of the registers 112 and 114 and the state of the register 110 at a time $t_1$ after one operational cycle from the time $t_0$. For the sake of convenience of explanation, it is assumed that the each byte data has a value identical with the corresponding byte address number of the SDRAM 104.

Referring to FIG. 5, 15-byte data "1"–"15" are extracted with the timing to from the 16-byte data "0"–"15" held in the register 112 one operational cycle before the timing $t_0$, wherein the 15-byte data thus extracted are stored in the register 114 from the lowermost bit thereof to the uppermost bit thereof. At the same time, 16-byte data "16"–"31" are read out from the corresponding address of 16-31 of the SDRAM 104 by the 2:1 selector 106 and the 16 byte data thus read out are stored in the register 112 from the lowermost bit thereof to the uppermost bit thereof. In the case the starting address of data reading is 3, the value of shifting becomes "2" from FIG. 4, and the place of digit of the data selected by the shift register 110 is moved collectively in the upper digit direction by two places. Thus, at the timing $t_0$, 16-byte data "3"–"18," ranging from three-digit place up from the lowermost bit of the register 114 to three-digit place up from the lowermost bit of the register 112, are selected by the shift register 110.

As represented in FIG. 6, the upper 15-byte data "17"–"31" is extracted from the 16-byte data "16"–"31" in the register 112 with the timing $t_1$, which is one operational cycle after the timing $t_0$, and the 15-byte data thus extracted are stored in the register 114 from the lowermost bit thereof to the uppermost bit thereof. At the same time, 16-byte data "32"–"47" is read out from the corresponding address of 32-47 of the SDRAM 104 by the 2:1 selector 106 and the 16-byte data thus read out are stored in the register 112 from the lowermost bit thereof to the uppermost bit thereof.

In the view of the fact that the starting address of data reading is 3, the value of shifting specified by the relationship of FIG. 4 becomes "2", and the place of digit of the data selected by the shift register 110 is moved collectively in the upper digit direction by two digits. Thus, at the timing $t_1$, 16-byte data "19"–"34," ranging from three-digit place up from the lowermost bit of the register 114 to three-digit place up from the lowermost bit of the register 112, are selected by the shift register 110.

By conducting the foregoing operations at the timing $t_0$ and timing $t_1$ consecutively, the 32 byte data "3"–"34" are read out continuously from the SDRAM 104 and supplied to the output terminal OUT.

According to the present invention as explained heretofore, it is not necessary to increase the capacity of the buffer unit used for temporarily storing the data read out from the SDRAM 104 or to provide a packing means between the SDRAM 104 and the buffer unit for packing the required part of the read out data. Thus, reading of data from the SDRAM 104 with a desired data width can be conducted efficiently in response to the shift signal shf of FIG. 4, even in such a case the starting point of data reading is located at an intermediate location of the memory data width.

Next, the operation of the registers 112 and 114 and the shift register 110 at the time of writing data into the SDRAM 104 will be described in detail. In the description hereinafter, it is assumed that the SDRAM 104 has a byte-width n of 16 (n=16) and that writing is conducted with regard to data of 29 bytes, starting from the address 3 located at an intermediate location of the memory data width to the address 31 of the SDRAM 104.

Figure 7:
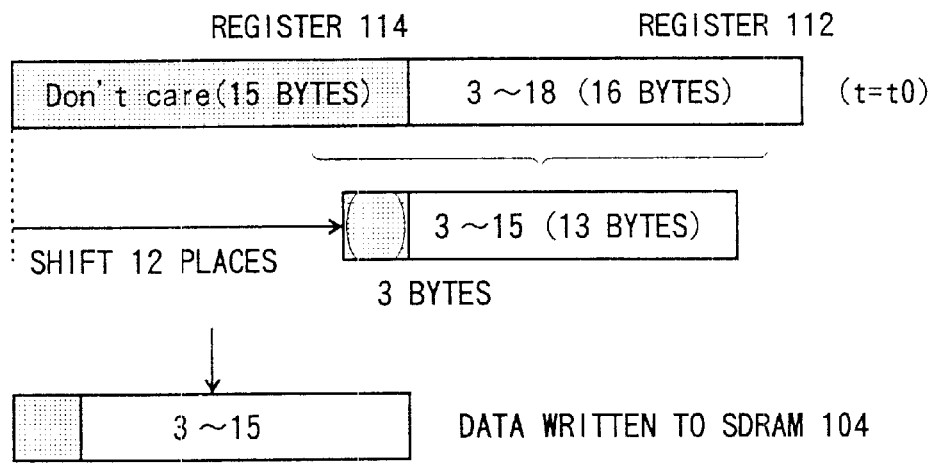
FIG. 7 is a diagram showing the state of the resister and the shifter as a time t0 when writing of data is to be made.
Figure 8:
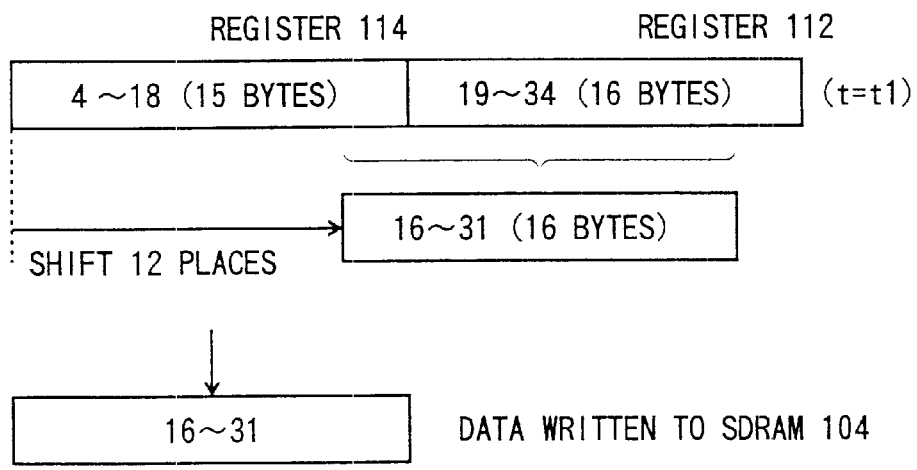
FIG. 8 is a diagram showing the state of the resister and the shifter as a time t1 when writing of data is to be made.

FIG. 7 shows the state of the registers 112 and 114 and further the state of the shift register 110 at the timing t0 for writing data. FIG. 8, on the other hand, shows the state of the registers 112 and 114 and further the state of the shift register 110 at the timing t1, which is one operational cycle after the timing t0. For the sake of convenience, it is assumed that the each byte data has a value identical with the corresponding byte address number of the SDRAM 104, similarly to the case of FIGS. 5 and 6 explained before.

Referring to FIG. 7, the register 114 stores therein the latter 15 bytes of the 16-byte data, which have been stored in the register 112 at the moment earlier than the timing $t_0$ by one operational cycle, from the lowermost bit thereof to the uppermost bit thereof at the timing $t_0$. At the same time, the register 112 stores therein 16-byte data "3"–"18" supplied externally via the 2:1 selector 106, from the lowermost bit thereof to the uppermost bit thereof. In view of the fact that the starting address of data writing is 3 and that the amount of the shift should be (16−4)=12 from FIG. 4, the data part that the shift register 110 extracts is shifted collectively in the upward direction by 12 places. In other words, the shift register 110 extracts 16-byte data "3"–"15," including the upper three places of the register 114 and the lower 13 places of the register 112.

With the timing $t_1$, which is one operational cycle after the timing $t_0$, 15-byte data "4"–"18" are extracted from the 16-byte data "3"–"18" held in the register 112 at the timing t0, and the 15-byte data thus extracted are stored in the register 114 from the lowermost bit thereof to the uppermost bit thereof. At the same time, the register 112 stores, from the lowermost bit thereof to the uppermost bit thereof, 16-byte data "19"–"34" supplied externally from the 2:1 selector 106.

In the event the starting address of data writing is 3 as represented in FIG. 4, the shift amount is given as (16−4)=12 and the part of the data extracted by the shifter 110 is shifted collectively in the upward direction by 12 places. Thereby, 16-byte data including the upper three bit data "16"–"18" of the register 114 and the lower 13 bit data "19"–"31" of the register 112 are extracted by the shift register 110. By conducting the foregoing process at the timing t0 and the timing t1 consecutively and continuously, the shift register 110 extracts 29 byte data "3"–"31" and writes the same into the SDRAM 104 starting from the start address 3 to the final address 31.

Thus, according to the present invention, it is possible to write data of desired byte size into the SDRAM 104 efficiently in response to the shift signal shf of FIG. 4, even in such a case in which the starting point of data writing is located at an intermediate location of the memory data width.

FIG. 8 shows the state of the register and the shifter as a time $t_1$ when writing of data is to be made. Register 114 and 112 are illustrated.

[Second Embodiment]

Figure 9:
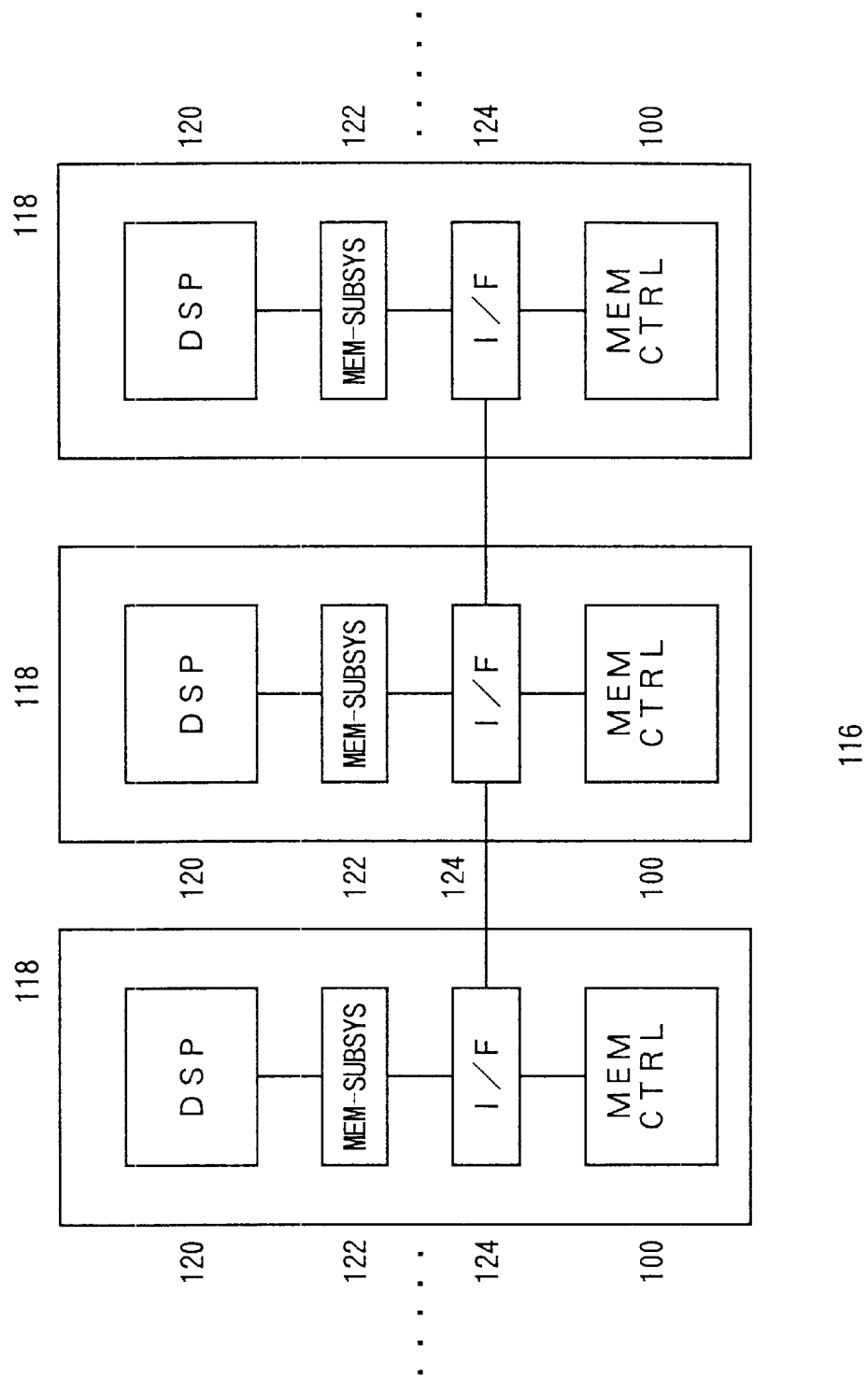
FIG. 9 is a block diagram showing the construction of an information processing apparatus according to an embodiment of the present invention.

FIG. 9 shows the construction of an information processing apparatus 116 according to a second embodiment of the present invention, wherein those parts corresponding to the part described previously are designated by the same reference numerals and the description thereof will be omitted.

Referring to FIG. 9, the information processing apparatus 116 is a multi-processor system and includes a plurality of processor systems 118 each including the memory controller 100.

More specifically, each of the processor systems 118 includes, in addition to the memory controller 100, a DSP 120, a memory sub-system 122, an interface circuit 124, and the like. The memory sub-system 122 may include a cache memory not shown. The data outputted by the memory controller 100 is supplied to the DSP 120 via the interface circuit 124 and the memory sub-system 122, and the DSP 120 carries out an operation based on the data supplied thereto.

It should be noted that the internal processing inside the memory controller 100 explained with reference to FIGS. 3–8 is applied also to transfer of data between the processors 118. For example, it is possible to write the data produced by one of the processors 118 into the SDRAM 104 of the memory controller 100 of another processor 118.

As noted above, the memory controller 100 of the present invention can carry out reading or writing of data efficiently even in such a case as the starting point of data reading or writing is located at an intermediate location of the memory data width. Therefore, it is not necessary to increase the capacity of the buffer unit cooperating with the SDRAM 104 or provide a packing means between the SDRAM 104 and the buffer unit for packing the portion of the data to be read out or to be written in. Therefore, it becomes possible to form the processor 118 or the multiprocessor system 116 using the memory controller 100 with a compact size or reduced cost.

Further, the present invention is not limited to the embodiments described heretofore, but various variations and modifications may be made without departing from the scope of the invention.

What is claimed is:

1. A memory controller, comprising:

a memory unit having an n-byte memory data width;

a register unit consecutively reading out, in response to an enable signal supplied thereto, data from said memory unit with every n-byte size, said register unit further recording therein said data read out from said memory unit in the form of continuous data of 2n−1 bytes including last data read out from said memory unit;

a shifter unit selecting consecutively, in response to a shift signal supplied thereto, a block of continuous n-byte data from said continuous data of 2n−1 bytes stored in said register unit, said shifter unit supplying said continuous n-byte data block to an output terminal; and a control unit controlling said memory unit, said register unit and said shifter unit, wherein said register unit includes a first register and a second register, said first register storing said data read out from the memory unit having n byte size, said second register extracting and storing therein n−1 byte data from said data held in said first register with a delay of one operational cycle with respect to an operation of said first register storing said data therein, said shifter extracting n byte data consecutively from said 2n−1 byte data continuously stored in said first and second registers.

2. A memory controller, comprising:

a memory unit having an n-byte memory data width;

a register unit consecutively receiving, in response to an enable signal supplied thereto, data from an external unit having n-byte size, said register unit further recording therein said data in the form of continuous data of 2n−1 bytes including last received data;

a shifter unit selecting consecutively, in response to a shift signal supplied thereto, a continuous n-byte data block from the continuous data of 2n−1 bytes stored in said register unit, said shifter unit storing said continuous n-byte data block in a specified location of said memory unit; and a control unit controlling said memory unit, said register unit and said shifter unit, wherein said register unit includes a first register and a second register, the first register storing said data supplied from said external unit having n-byte size, said second register extracting and storing therein n−1 byte data from said data held in said first register with a delay of one operational cycle with respect to an operation of said first register storing said data therein, said shifter extracting n byte data consecutively from said 2n−1 byte data continuously stored in said first and second registers.

3. A memory controller, comprising:

a memory unit having an n-byte memory data width;

a register unit carrying out, in response to an enable signal supplied thereto, one of a reading operation reading out data consecutively from said memory unit having n-byte size and a receiving operation receiving data consecutively from an external unit with every n-byte size, said register unit further recording therein said data read out from said memory unit or received from said external unit in the form of continuous data of 2n−1 bytes including last acquired data;

a shifter unit selecting consecutively, in response to a shift signal supplied thereto, a block of continuous n-byte data from said continuous data of 2n−1 bytes stored in said register unit, said shifter unit supplying said continuous n-byte data block to an output terminal when in a mode of said reading operation, said shifter unit storing said continuous n-byte data block in a specified location of said memory unit when in a mode of said receiving operation; and a control unit controlling said memory unit, said register unit and said shifter unit, wherein said register unit includes a first register and a second register, the first register storing one of said data read out from the memory unit having n-byte size or said data supplied from said external unit with every n byte size, said second register extracting and storing therein n−1 byte data from said data held in said first register with a delay of one operational cycle, said shifter extracting n byte data consecutively from said 2n−1 byte data continuously stored in said first and second registers.

4. A memory controller, comprising:

a memory unit having an n-byte memory data width;

a register unit carrying out, in response to an enable signal supplied thereto, one of a reading operation reading out data consecutively from said memory unit having n-byte size and a receiving operation receiving data consecutively from an external unit with every n-byte size, said register unit further recording therein said data read out from said memory unit or received from said external unit in the form of continuous data of 2n−1 bytes including last acquired data;

a shifter unit selecting consecutively, in response to a shift signal supplied thereto, a block of continuous n-byte data from said continuous data of 2n−1 bytes stored in said register unit, said shifter unit supplying said continuous n-byte data block to an output terminal when in a mode of said reading operation, said shifter unit storing said continuous n-byte data block in a specified location of said memory unit when in a mode of said receiving operation;

a control unit controlling said memory unit, said register unit and said shifter unit; and a selector selecting, in response to a select signal, one of said data read out from said memory unit with every n byte width or, said data given by said external unit with every n-byte width, said selector supplying selected data to said register unit.

5. An information processing apparatus, comprising:

a processor;

a memory controller; and an interface circuit connecting said processor and said memory controller with each other, said processor carrying out an operation based on data supplied thereto from said memory controller via said interface circuit, said memory controller comprising:

a memory unit having an n-byte memory data width;

a register unit consecutively reading out, in response to an enable signal supplied thereto, data from said memory unit having n-byte size, said register unit further recording therein said data read out from said memory unit in the form of continuous data of 2n−1 bytes including last data read out from said memory unit;

a shifter unit selecting consecutively, in response to a shift signal supplied thereto, a block of continuous n-byte data from said continuous data of 2n−1 bytes stored in said register unit, said shifter unit supplying said continuous n-byte data block to an output terminal; and a control unit controlling said memory unit, said register unit and said shifter unit, wherein said register unit includes a first register and a second register, said first register storing said data read out from the memory unit having n byte size, said second register extracting and storing therein n−1 byte data from said data held in said first register with a delay of one operational cycle with respect to an operation of said first register storing said data therein, said shifter extracting n-byte data consecutively from said 2n−1 byte data continuously stored in said first and second registers.

6. An information processing apparatus, comprising:

a processor;

a memory controller; and an interface circuit connecting said processor and said memory controller with each other, said processor carrying out an operation based on data supplied thereto from said memory controller via said interface circuit, said memory controller comprising:

a memory unit having an n-byte memory data width;

a register unit consecutively receiving, in response to an enable signal supplied thereto, data from an external unit having n-byte size, said register unit further recording therein said data in the form of continuous data of 2n−1 bytes including last received data;

a shifter unit selecting consecutively, in response to a shift signal supplied thereto, a continuous n-byte data block from the continuous data of 2n−1 bytes stored in said register unit, said shifter unit storing said continuous n-byte data block in a specified location of said memory unit; and a control unit controlling said memory unit, said register unit and said shifter unit, wherein said register unit includes a first register and a second register, the first register storing said data supplied from said external unit having n-byte size, said second register extracting and storing therein n−1 byte data from said data held in said first register with a delay of one operational cycle with respect to an operation of said first register storing said data therein, said shifter extracting n byte data consecutively from said 2n−1 byte data continuously stored in said first and second registers.

7. An information processing apparatus, comprising:

a processor;

a memory controller; and an interface circuit connecting said processor and said memory controller with each other, said processor carrying out an operation based on data supplied thereto from said memory controller via said interface circuit, said memory controller, comprising:
  a memory unit having a n-byte memory data width;
  a register unit carrying out, in response to an enable signal supplied thereto, one of a reading operation reading out data consecutively from said memory unit having n-byte size or a receiving operation receiving data consecutively from an external unit with every n-byte size, said register unit further recording therein said data read out from said memory unit or received from said external unit in the form of continuous data of 2n−1 bytes including last acquired data;
  a shifter unit selecting consecutively, in response to a shift signal supplied thereto, a block of continuous n-byte data from said continuous data of 2n−1 bytes stored in said register unit, said shifter unit supplying said continuous n-byte data block to an output terminal when in a mode of said reading operation, said shifter unit storing said continuous n-byte date block in a specified location of said memory unit when in a mode of said receiving operation; and
  a control unit controlling said memory unit, said register unit and said shifter unit,
  wherein said register unit includes a first register and a second register, the first register storing one of said data read out from the memory unit with every n byte size or said data supplied from said external unit having n-byte size, said second register extracting and storing therein n−1 byte data from said data held in said first register with a delay of one operational cycle, said shifter extracting n byte data consecutively from said 2n−1 byte data continuously stored in said first and second registers.

8. An information processing apparatus, comprising:

a processor;

a memory controller; and an interface circuit connecting said processor and said memory controller with each other, said processor carrying out an operation based on data supplied thereto from said memory controller via said interface circuit, said memory controller, comprising:
  a memory unit having a n-byte memory data width;
  a register unit carrying out, in response to an enable signal supplied thereto, one of a reading operation reading out data consecutively from said memory unit having n-byte size or a receiving operation receiving data consecutively from an external unit with every n-byte size, said register unit further recording therein said data read out from said memory unit or received from said external unit in the form of continuous data of 2n−1 bytes including last acquired data;
  a shifter unit selecting consecutively, in response to a shift signal supplied thereto, a block of continuous n-byte data from said continuous data of 2n−1 bytes stored in said register unit, said shifter unit supplying said continuous n-byte data block to an output terminal when in a mode of said reading operation, said shifter unit storing said continuous n-byte date block in a specified location of said memory unit when in a mode of said receiving operation; and
  a control unit controlling said memory unit, said register unit and said shifter unit; and
  a selector selecting, in response to a select signal, one of said data read out from said memory unit having n-byte width or said data given by said external unit with every n byte width, said selector supplying selected data to said register unit.

* * * * *